(12) United States Patent
Yamauchi

(10) Patent No.: US 7,018,472 B2
(45) Date of Patent: Mar. 28, 2006

(54) PHOTORESIST APPLYING DEVICE AND APPLYING METHOD THEREFOR

(75) Inventor: Toshikazu Yamauchi, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/670,725

(22) Filed: Sep. 26, 2003

(65) Prior Publication Data

US 2004/0060949 A1 Apr. 1, 2004

Related U.S. Application Data

(60) Provisional application No. 60/413,948, filed on Sep. 27, 2002.

(51) Int. Cl.
*B05C 5/00* (2006.01)

(52) U.S. Cl. .................. 118/300; 118/52; 118/612

(58) Field of Classification Search ........... 118/52, 118/612, 300; 396/611, 604
See application file for complete search history.

(56) References Cited

U.S. PATENT DOCUMENTS

2002/0124798 A1* 9/2002 Kitano et al. ............... 118/300

FOREIGN PATENT DOCUMENTS

JP 09206584 A 8/1997

* cited by examiner

*Primary Examiner*—Chris Fiorilla
*Assistant Examiner*—Yewebdar Tadesse
(74) *Attorney, Agent, or Firm*—Rabin & Berdo, PC

(57) ABSTRACT

A photoresist applying device of the present invention is provided with an air-bubble collecting part on a photoresist flow passage at its predetermined part of a nozzle pipe directly connected to a nozzle tip. As a result, there is no possibility of ejection at the nozzle tip onto a substrate simultaneously with ejection of photoresist.

8 Claims, 2 Drawing Sheets

PHOTORESIST APPLYING DEVICE AND APPLYING METHOD THEREFOR

The rights of priority are claimed under 35 USC §119 of U.S. Provisional Application No. 60/413,948, filed Sep. 27, 2002.

FIELD OF THE INVENTION

The present invention relates to a photoresist applying device and applying method therefor for applying photoresist onto a semiconductor substrate surface, and more particularly to a photoresist applying device and applying method therefor characterized in a nozzle pipe structure.

BACKGROUND OF THE INVENTION

As shown in FIG. 1, the photoresist flow passage provided in the photoresist applying device of prior art is structured by a photoresist bottle 1, a buffer tank 2, a pump 3, a filter 4, an ejection valve 5, a suck-back valve 6, nozzle pipe 7b, and a nozzle tip 8. The parts of from the photoresist bottle 1 to the ejection valve 5 are respectively connected by the pipe 7a.

At first, in a waiting state of the conventional photoresist applying device, the photoresist stored in the photoresist bottle 1 is previously filled up to a tip end of the nozzle tip 8 through the various parts from the buffer tank 2 to the nozzle pipe 7. When applying photoresist to a semiconductor substrate 100 surface, the photoresist is ejected at the nozzle tip 8 by an ejecting operation of the pump 3 and the simultaneous opening/closing operation of the ejection valve 5. Furthermore, by the immediately after continuing sucking operations of the pump 3, photoresist is sucked from the photoresist bottle 1 into the pump 3, to prepare for the next ejection.

Incidentally, in order to prevent photoresist from dripping off the tip end of the nozzle tip 8 after ejecting photoresist, the suck-back valve 6 is in a mechanism to suck photoresist back from the nozzle tip 8 side, which is usually in an integral structure with the ejection valve 5 in many cases. The buffer tank 2 has an operation that, in the case an air bubble is mixed in a supply pipe 7a interior during exchanging the empty photoresist bottle 1, the air bubble is removed from a drain pipe attached on the buffer tank 2 by pressurizing the photoresist bottle 1 with using an N2 gas or the like, and a function to detect a fact the photoresist bottle 1 is emptied of photoresist by a medical-fluid sensor provided on the buffer tank 2.

However, in the photoresist applying device of the above structure, there is a conspicuous problem that air bubbles occur at various points of the photoresist flow passage of from the photoresist bottle 1 to the nozzle tip 8 and stay in the photoresist within the pipe 7a. Although this can be considered responsible for gas/liquid separation in the photoresist liquid, the major factor is assumably by the influence of negative pressure as caused by sucking operation of the pump 3 or sucking operation of the diaphragms of the ejection valve 5 and suck-back valve 6, or natural separation within the filter 4.

In this manner, the air bubbles caused or staying at various points of the photoresist flow passage move in the photoresist pipe 7a, to be ejected together with photoresist from the nozzle tip 8 to a semiconductor substrate 100 (hereinafter substrate) surface depending upon photoresist ejecting operation of the pump 3. The air bubble ejected on the substrate 100 surface, during spin-coating photoresist to the substrate 100 surface, flows and moves radially over the substrate 100 surface from a center toward the outer periphery of the substrate 100 surface. Finally, it is spun out of the substrates 100 surface into vanishing by rotation of the substrate 100. At that time, with respect to the even film thickness of the photoresist film entirety applied over the substrate 100 surface, the film thickness varies over a path the air bubble have flowed, to appear as radial color unevenness in external appearance. In the uneven color region, because of film thickness variation, integrated circuits are caused partial variation in wiring dimensions during the subsequent integrated-circuit printing process onto the substrate 100 surface, resulting in a cause of trouble such as circuit performance instability or poor operation when made into a complete product.

SUMMARY OF THE INVENTION

It is an object of the present invention to provide a photoresist applying device capable of suppressing ejection of the air bubble at a nozzle tip onto a substrate simultaneously with photoresist ejection.

In order to achieve the object of the invention, a photoresist applying device of the invention is characterized in that an air-bubble collecting part is provided in a photoresist flow passage at a predetermined part of a nozzle pipe directly connected to a nozzle tip.

DETAILED DESCRIPTION OF PREFERRED EMBODIMENTS OF THE INVENTION

Figure 1:
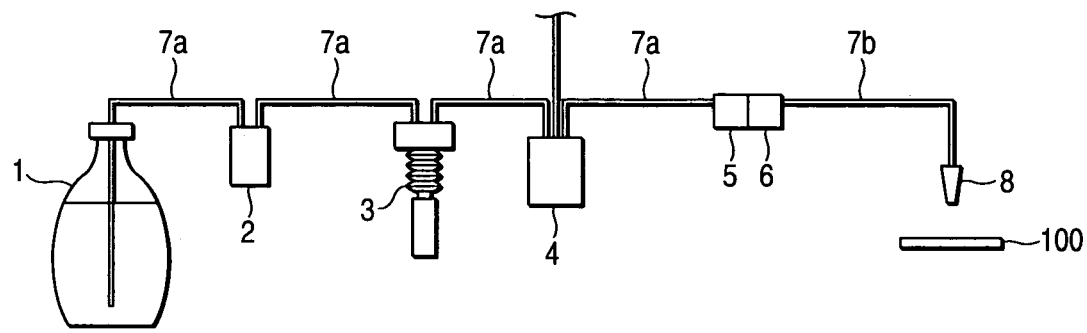
FIG. 1 is a view for explaining a photoresist applying apparatus and applying method therefor in a prior art.
Figure 2:
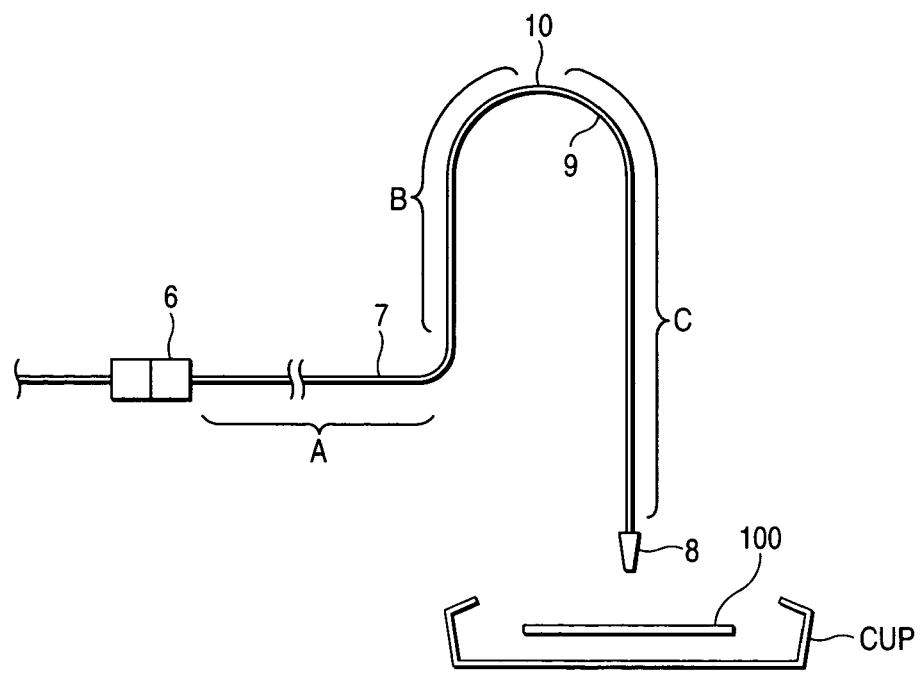
FIG. 2 is a view for explaining a photoresist applying apparatus and applying method therefor in a first embodiment of the present invention.

FIG. 2 is a view for explaining a photoresist applying device and an applying method therefor of a first embodiment of the present invention. The photoresist applying device in the first embodiment of the invention, in its general constituent elements, is similar to the conventional photoresist applying device shown in FIG. 1.

The photoresist applying device of the first embodiment of the invention is characterized in that an air-bubble collecting part is provided on a photoresist flow passage at its predetermined part of nozzle pipe 7 directly connected to a nozzle tip 8. The nozzle pipe 7 has an external appearance in a shape curved in an inverted U-form (∩). Specifically, the nozzle pipe 7 is structured by a horizontal part A, a rise part B and a fall part C in the order from the suck-back valve 6 side, and structured to provide a nozzle tip 8 at a tip end of the fall part C. By thus structuring the nozzle pipe 7, a curved part 9 is made between the rise and fall parts so that a top dead center 10 in the curved part 9 serves as an air-bubble collecting part. Herein, it is important to design the fall part diameter and length of nozzle pipe 7 to have an interior bulk of pipe capable of securing a photoresist amount greater than the photoresist amount of one projection.

Meanwhile, the nozzle tip 8 is provided in a position in the above of a substrate 100 mounting part in the photoresist applying device (above a cup part) and in the center of the substrate 100 surface.

In the below, in the waiting state of the photoresist applying device in a first embodiment of the present invention, the air bubble caused in the photoresist flow passage due to the influence of the negative pressure caused by sucking operation of the pump 3 shown in FIG. 1, sucking operation of the diaphragms of the ejection valve 5 and suck-back valve 6 or natural separation within the filter 4 or the like moves in the photoresist pipe and reaches the nozzle pipe 7. Furthermore, the air bubble moves up in the nozzle pipe 7 toward the inverted U-formed curved part 9 due to its buoyant force, and stays at the top dead center 10 of the curved part 9. Then, during the process of photoresist application onto the substrate 100 surface, the air bubble staying at the top dead center 10 moves simultaneously with ejection of photoresist and moves down toward the nozzle tip 8.

Herein, as described in the above, the air-bubble collecting part is provided on the photoresist flow passage at its predetermined part of the nozzle pipe 7 directly connected to the nozzle tip 8. As a result that, even in case the air bubble moves down by the same distance as the photoresist in an amount of once ejection moves in the nozzle pipe 7, the air bubble comes to a stop at between the nozzle tip 8 and the top dead center 10 simultaneously with ejection end of photoresist. Thus, there is no possibility of ejection together with photoresist from the nozzle tip 8 onto the substrate 100. The ejection process of photoresist is generally carried out repeatedly at an interval, for example, of 60 seconds. Accordingly, the air bubble in stoppage at between the nozzle tip 8 and the top dead center 10 again moves up reversely toward the top dead center 10 by a buoyant force and stays again at the top dead center 10.

As described above, according to the first embodiment, the air-bubble collecting part is provided on the photoresist flow passage at its predetermined part of the nozzle pipe 7 directly connected to the nozzle tip 8. As a result, the air bubble caused in the photoresist flow passage and stays at the top dead center 10 of the curved part 9 in the nozzle pipe 7 temporarily moves down toward the nozzle tip 8 during ejecting photoresist but again floats up to and stays at the top dead center 10. Thus, there is absolutely no possibility of ejection at the nozzle tip 8 onto the substrate simultaneously with photoresist ejection. Meanwhile, the diameter and length of the fall, part (pipe part between the nozzle tip 8 and the top dead center 10) of the nozzle pipe 7 is designed to have a pipe interior bulk capable of securing a photoresist amount greater than the photoresist amount of once projection, thus positively suppressing the air bubble projection.

Accordingly, when spin-coating photoresist ejected onto the substrate 100 surface, there occurs no color unevenness in radial form caused by a path where the air bubble have flowed on the application film. The film thickness variation in the uneven color region can be prevented in advance from causing a trouble such as circuit performance instability, poor operation or the like due to partial variation of wiring dimensions caused on an integrated circuit during the later integrated-circuit printing process onto a semiconductor substrate surface, for example.

Figure 3:
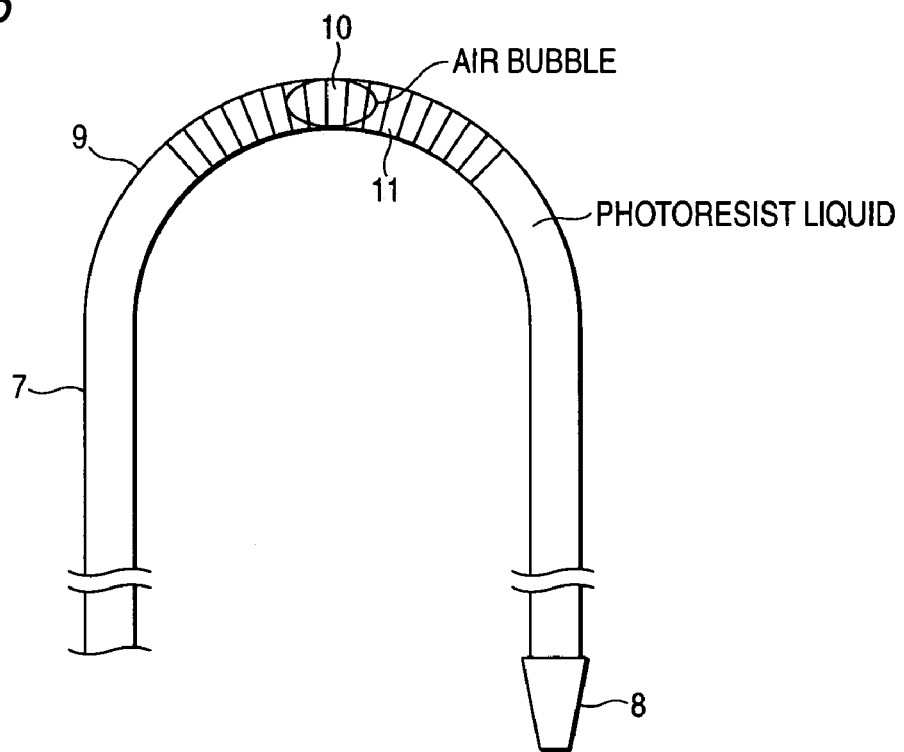
FIG. 3 is a view for explaining a photoresist applying apparatus and applying method therefor in a second embodiment of the present invention.

FIG. 3 is a view for explaining a photoresist applying apparatus and application method therefor according to a second embodiment of the invention.

A nozzle pipe 7 is structured by a transparent pipe, e.g. Teflon tube, wherein graduations 11 are provided on a pipe outer wall close to the top dead center 10. The graduations are, for example, at a 2-millimeter interval.

Because the nozzle pipe 7 is a transparent pipe, the air bubble staying at the top dead center 10 is quite obvious in its amount. Herein, because the graduations 11 are provided on the pipe outer wall close to the top dead center 10, the size of the air bubble staying at the top dead center 10 can be visually measured.

As described above, the photoresist applying apparatus and application method therefor according to the second embodiment of the invention provide the following effect.

In the case the amount of the air bubble staying at the top dead center 10 is excessive, there is a need to carry out an air bubble removal operation. By previously defining the amount of the air bubble requiring air bubble removal and measuring an air bubble size with the graduations 11 as required, the necessity for air bubble removal operation can be easily decided.

Figure 4:
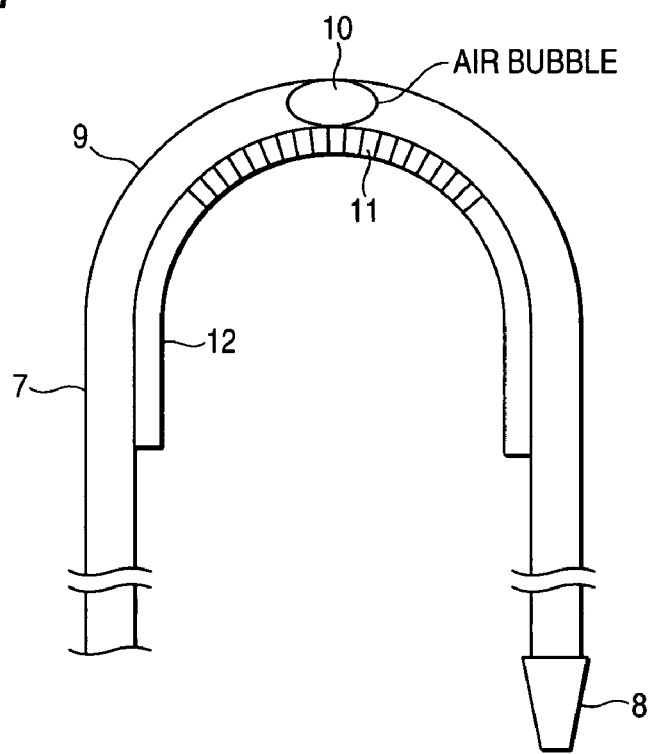
FIG. 4 is a view for explaining a photoresist applying apparatus and applying method therefor in a third embodiment of the present invention.

FIG. 4 is a view for explaining a photoresist applying apparatus and application method therefor according to a third embodiment of the invention.

A curved part 9 of a nozzle pipe 7 is arranged along a jig 12, for example, made of resin or metal in a curved form. At the same time, the jig 12 is provided with graduations 11, in which case the graduations are not directly provided on the curved part 9 of the nozzle pipe 7 itself.

The curved part 9 of the nozzle pipe 7 is fixed and supported by the jig 12. Meanwhile, because there are no graduations on the nozzle pipe 7 itself, the amount of the air bubble staying at the top dead center 10 is measured with the graduations 11 provided on the jig 12.

As described above, the photoresist applying apparatus and application method therefor according to the third embodiment of the invention provides the following effect.

Because the curved part 9 of the nozzle pipe 7 is fixed and supported by the jig 12, the curved part 9 can keep the stable shape without deformation due to aging or any external force or the like. Meanwhile, in the case of measuring the amount of the air bubble staying at the top dead center 10 by the graduations 11 provided on the jig 12, there is no possibility that the air bubble itself be not easily seen by the graduations because of the absence of graduations on the nozzle pipe 7 itself.

What is claimed is:

1. A photoresist applying device, comprising:
   an air-bubble collecting part provided on a photoresist flow passage at a predetermined part of a nozzle pipe directly connected to a nozzle tip;
   wherein the nozzle pipe is in such a shape as continuing in a rise part, a horizontal part and a fall part; and
   wherein a curved part is made at between the rise part and the fall part, the curved part having a top dead center serving as the air-bubble collecting part.

2. A photoresist applying device according to claim 1, wherein graduations are provided on a pipe outer wall close to the top dead center.

3. A photoresist applying device according to claim 2, wherein a staying amount of air bubble requiring air-bubble removal is previously defined and a size of air bubble is measured by the graduations as required.

4. A photoresist applying device according to claim 1, wherein the curved part of the nozzle pipe is fixed and supported by a jig.

5. A photoresist applying device, comprising:
   a nozzle pipe having a first end and a second end, through which photoresist flows in a direction from the first end to the second end; and a nozzle tip connected to the second end of said nozzle pipe, and through which the photoresist is discharged after flowing through said nozzle pipe;

wherein said nozzle pipe has an air-bubble collecting part disposed between the first end and the second end, and through which the photoresist flows prior to being discharged through said nozzle tip.

6. A photoresist applying device according to claim 5, wherein the nozzle pipe has a rise part, a horizontal part, a fall part and a curved part disposed between the rise part and the fall part, the curved part having a top dead center serving as the air-bubble collecting part.

7. A photoresist applying device according to claim 5, further comprising a valve connected to the first end of said nozzle pipe, and a supply pipe connected to the valve, the photoresist flowing from the supply pipe, through the valve, through the nozzle pipe and through the nozzle tip, respectively.

8. A photoresist applying device according to claim 7, wherein the valve is a suck-back valve.

* * * * *